United States Patent
Garrett

(12) 
(10) Patent No.: US 7,190,721 B2
(45) Date of Patent: Mar. 13, 2007

(54) ERROR CONVERGENCE MEASUREMENT CIRCUIT FOR PROVIDING CONVERGENCE OF A FILTER

(75) Inventor: David Garrett, Pyrmont (AU)

(73) Assignee: Lucent Technologies Inc., Murray Hill, NJ (US)

( * ) Notice: Subject to any disclaimer, the term of this patent is extended or adjusted under 35 U.S.C. 154(b) by 892 days.

(21) Appl. No.: 10/183,378

(22) Filed: Jun. 28, 2002

(65) Prior Publication Data

US 2004/0001538 A1   Jan. 1, 2004

(51) Int. Cl.
*H03H 7/30* (2006.01)
*H03H 7/40* (2006.01)
*H03K 5/159* (2006.01)

(52) U.S. Cl. .................. 375/232; 375/285; 375/350; 714/799

(58) Field of Classification Search ........ 375/229–236, 375/285, 350; 708/300, 322, 323; 714/746, 714/799
See application file for complete search history.

(56) References Cited

U.S. PATENT DOCUMENTS

| | | | | |
|---|---|---|---|---|
| 5,311,503 A | * | 5/1994 | Kokubo et al. | 370/290 |
| 5,426,597 A | * | 6/1995 | Herchen et al. | 708/322 |
| 5,428,562 A | * | 6/1995 | Gay | 708/322 |
| 5,668,747 A | * | 9/1997 | Ohashi | 708/322 |
| 6,810,089 B2 | * | 10/2004 | Chouly | 375/285 |
| 2003/0023173 A1 | * | 1/2003 | Bratteli et al. | 600/485 |
| 2004/0229567 A1 | * | 11/2004 | Bilgic et al. | 455/63.1 |
| 2006/0146738 A1 | * | 7/2006 | Lu | 370/286 |

OTHER PUBLICATIONS

Garrett, David et al. "A Low Power Normalized-LMS Decision Feedback Equalizer For A Wireless Packet Modem." *ISLPED '02*, Aug. 12-14, 2002, Monterey, CA.

* cited by examiner

*Primary Examiner*—Jean B. Corrielus

(57) ABSTRACT

An error convergence measurement circuit for providing convergence of a filter includes a terminating component configured to terminate filter convergence independent of an operating environment of the filter. Selectable termination threshold levels are provided.

19 Claims, 4 Drawing Sheets

ERROR CONVERGENCE MEASUREMENT CIRCUIT FOR PROVIDING CONVERGENCE OF A FILTER

FIELD OF THE INVENTION

The present invention relates generally to filters having convergence training.

BACKGROUND OF THE INVENTION

One of the challenges of transmitting information at high bit rates over a wireless channel is that frequency selective fading causes significant inter-symbol interference (ISI). For example, multipath in the main signal may cause delay and distortion in the signal. This is especially the case in wireless communications wherein channels are constantly changing due to signal rotation from transmitting towers and beam forming.

In the time domain, ISI is modeled by convolving the transmitted symbols with the channel impulse response. A filter, including for example, an equalizer may be used at the receive end to compensate for the distortion introduced by the channel. The goal of an equalizer is to reverse the effects of the channel, and approximate the originally transmitted symbols (i.e., realign the signal). One type of equalizer structure for providing optimal transmissions is a maximum likelihood sequence estimator (MLSE). Although the MLSE provides optimal equalization, the complexity of an MLSE grows exponentially with the length of the channel impulse response, due in part to the matrix inversion process typically implemented. A decision feedback equalizer (DFE) may be used to approximate the MLSE, but it typically provides sub-optimal approximation. An advantage of this approach is that complexity only grows linearly with the length of the channel. A DFE is a filter with two sets of filtering coefficients (taps). One set (the "forward" coefficients) are applied to the received sample stream. The second set (the "backward" or "feedback" coefficients) are applied to previous symbol decisions. The function of the backward set is to cancel the ISI due to symbols that have already been detected. The coefficient sets are jointly optimized in order to minimize a cost function. Typically, the tap values are determined using an adaptive training algorithm. The adaptive algorithm provides tap update values to the previous set of tap values, and is provided with a training sequence which it may iterative over numerous times.

Known devices for providing convergence processes for training taps of a filter measure the error in the signal and attempt to reduce that error to converge to a solution. This is typically accomplished using an iterative process that applies correction coefficients to taps within the filter. The convergence training process is terminated upon reaching a predetermined minimum error threshold. A common convergence measurement process includes setting an absolute threshold for the mean square error (MSE) value for signals equalized using the adaptive DFE. Thus, training on the taps continues until the MSE is below the pre-determined threshold. One problem with this training process is that the threshold value requires knowledge of channel conditions. If the threshold is set too high, the equalizer will stop training earlier than required, thereby degrading the system performance. On the other hand, if the threshold is too low, the equalizer performs needless training iterations. Thus, because the operating environment may constantly change, the threshold value also may need to be modified constantly. A complex process results that typically requires many iterations to converge to a solution.

SUMMARY OF THE INVENTION

An error convergence measurement circuit of the present invention provides termination of tap training earlier in the convergence process, thereby allowing a filter (e.g., equalizer) to disable further unnecessary training. Power consumption is also reduced as a result of performing less iterative processes to determine filter convergence. Self-termination with selectable accuracy is also provided for setting a particular convergence threshold level.

Generally, the error convergence measurement circuit determines convergence of a filter (e.g., an equalizer) independent of the operating environment (e.g., signal-to-noise ratio or channel information) of that filter. The error convergence measurement circuit provides selectable accuracy for termination of the training process and includes a terminating component that is configured to terminate an iterative convergence (i.e., error measurement) process when the percentage difference in the error (e.g., average of the mean square error) between a previous iteration and a present iteration is less than a predetermined threshold. Essentially, the error convergence measurement circuit measures the percentage change in data signal error to determine convergence during tap training. The percentage change in the mean square error of the signal is measured to determine convergence and the training process is terminated upon reaching an acceptable convergence level.

One embodiment of the error convergence measurement circuit includes an error detection circuit that measures the average of the mean square error of data signals (i.e., difference between an actual signal and expected signal) to determine data signal error values. A terminating component receives the data signal error values and determines the percentage change between a current data signal error value and a previous data signal error value. The terminating component terminates error detection based upon the measured percentage change and a predetermined threshold value. The terminating component includes an accuracy selector providing selectable accuracy for error detection (i.e., convergence) and terminates the data signal error measuring process based upon the selected accuracy level.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. Although the present invention is described in connection with specific component parts for use with a particular filter, it is not so limited and different or additional component parts may be implemented as part of the invention.

A general description of a filter, and in particular a decision feedback equalizer (DFE) in connection with which the present invention may be implemented will first be provided. A detailed structural description of the invention and its operation will follow.

Figure 1:
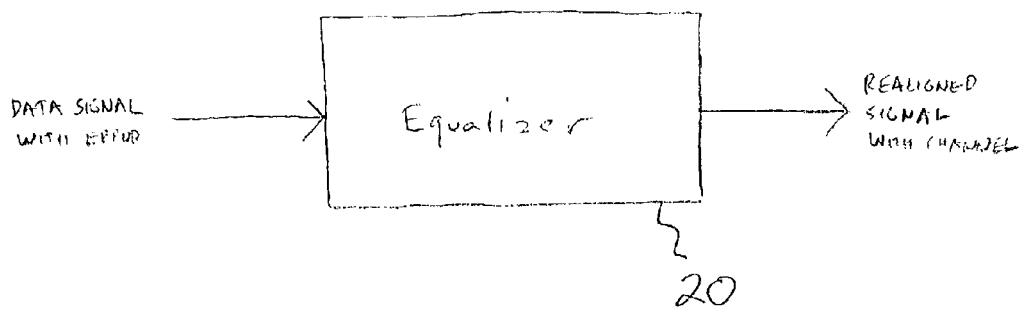
FIG. 1 is a simplified block diagram of an equalizer in connection with which an error convergence measurement circuit of the present invention may be implemented.

In general, a filter provides for passing signals with frequencies within certain designated ranges and rejecting or attenuating signals with frequencies outside these ranges. In communication systems, such as, for example wireless communication systems, digital filters such as finite impulse response (FIR) filters may be used to filter signal noise and provide communication with fewer errors. In such systems, the frequency response of a particular communication channel is usually not known to a sufficient accuracy or is not sufficiently stable to allow a single receiver to be designed that includes optimal communication over numerous channels. As a result, a filter, and typically an equalizer 20, as shown in FIG. 1, is used to realign signals and match the receiver to a particular channel to optimize receiver sensitivity, which is usually set to a predetermined level. Adaptive equalizers, such as ones providing feedback (e.g., DFE), dynamically change their operating characteristics to match variations in a particular channel.

Specifically, and with reference to DFEs, such equalizers may be used in wireless communication systems, including, for example, in a modem for a fixed wireless system. In these types of systems, time division multiple access (TDMA) is used to allow multiple users to share the communication channels (e.g., radio resource). Data and voice traffic is segmented into packets, modulated, and a small sequence of symbols is added as a preamble to the data packet. The preamble symbols provide operating information for use by the communication system, including information allowing the equalizer at the receiver to be trained (i.e., provide convergence) to the instantaneous channel before the data symbols are equalized. Different processes, including various algorithms may be used to train these equalizers. For example, one known algorithm used to provide convergence (i.e., equalize to a particular channel) for adaptive DFEs is a normalized least mean square (NLMS) iterative algorithm.

Figure 2:
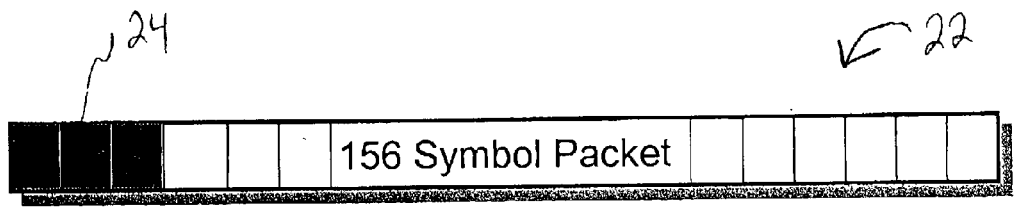
FIG. 2 is an illustration of a sample packet having a preamble that may be used for equalizer convergence training.

Different sampling requirements (e.g., T/2 fractionally spaced samples) and symbol rates (e.g., 8Msymbol/s) may be supported by an equalizer using the NLMS algorithm. Further, and as shown in FIG. 2, the data packet 22 for use in transmission comprises a specific number of data symbols, which may be of different sizes depending upon the particular system, and includes a preamble portion 24 with training symbols (e.g., 312 symbols, including up to 32 training symbols).

Figure 3:
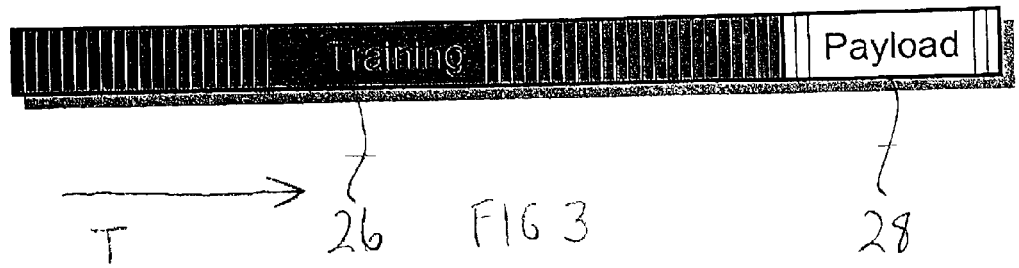
FIG. 3 is an illustration showing a training process of an equalizer versus a payload transmission process of the equalizer.

In operation, and as shown in FIG. 3, the workload of the equalizer is divided between a training period 26 and processing period 28 for processing the data symbol payload. To obtain satisfactory equalizer performance, it is necessary to iterate on the training symbols of each packet many times until the taps have converged before processing the payload. Thus, assuming that processing a training symbol takes the same amount of time as processing a payload symbol, the maximum number of training iterations that can be supported is related to the training preamble size and how many symbols the equalizer can process per received symbol. The following equation defines the maximum number of training iterations for the adaptive DFE architecture as a function of an increase in processing speed (i.e., decrease in processing period 28), K, the total length of a packet, L, and the length of the training sequence, T.

$$A = \frac{KL - (L - T)}{T}$$

A training iteration is defined as one pass through the training preamble and updating the tap weights for each symbol. Thus, the total number of training iterations is dependent on the processing speed increase and the ratio of the total packet size to the training sequence length. For example, with a processing speed increase of 8, a packet length of 133 and a 13 symbol training sequence, the equalizer can provide over 72 training iterations.

Figure 4:
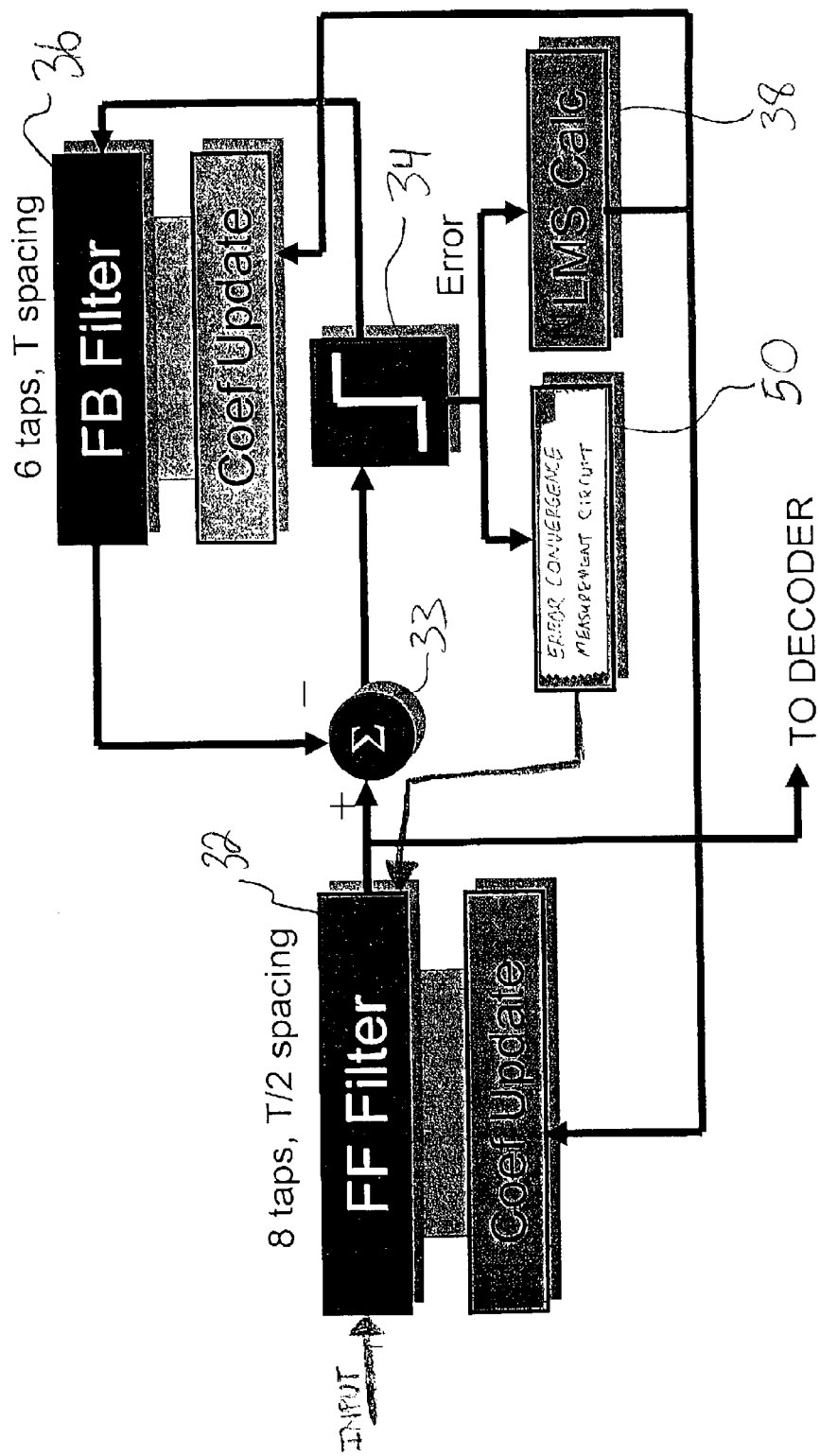
FIG. 4 is a block diagram of an equalizer in connection with which an error convergence measurement circuit of the present invention may be implemented.

FIG. 4 illustrates generally an exemplary adaptive DFE 30 in connection with which an error convergence measurement circuit 50 of the present invention may be implemented. In this architecture, a feed forward (FF) filter 32 receives an input signal and compensates for signal error before outputting the signal to a decoder. More specifically, the FF filter 32 includes a plurality of taps (e.g., 8 taps) that are used to compensate for signal error, such as the delay spread of the channel. The plurality of taps apply correction coefficients to the signal during a convergence process to compensate for the signal error. A feedback (FB) filter 36 having a plurality of taps is also provided for equalization. The output of each of the FF filter 32 and FB filter 36 are supplied to a summer 33 that sums the output of the FF filter 32 with the negative of the FB filter 36 (i.e., subtracts output of FB filter 36 from output of FF filter 32). A slicer 34 receives the summed signal output and generates the hard decisions for each data symbol within a data packet of the signal. When processing the payload of the data packet, the slicer 34 outputs the closest constellation point to the symbol output of the FF and FB filters 32 and 36. However, during convergence training, the slicer 34 outputs the expected training symbol regardless of the input to the slicer 34.

The slicer 34 outputs a complex error signal to an error calculation component 38 (i.e., NLMS error calculation component). The error calculation component 38 uses an NLMS algorithm to calculate updated coefficient values to be applied to the filters 32 and 36. The structure of an iterative NLMS process for providing the error calculation component 38 is known and many standard techniques can be used for its implementation, including using known NLMS tap update equations.

The slicer 34 also outputs the complex error signal to an error convergence measurement circuit 50 that determines when to terminate the convergence process. The DFE 30 continues to train the filter taps using the decision-directed output of the slicer 34 until the error convergence measurement circuit 50 generates a terminate signal. A termination algorithm implemented by the error convergence measurement circuit 50 measures the average of the mean square error (MSE) received from the slicer 34 to determine convergence of the training process. When convergence of the training process is reached, as defined by a threshold value, the error convergence measurement circuit 50 generates a control signal (i.e., terminate signal) that is provided to the FF filter 32 to terminate the convergence training process (i.e., convergence has been reached).

Figure 5:
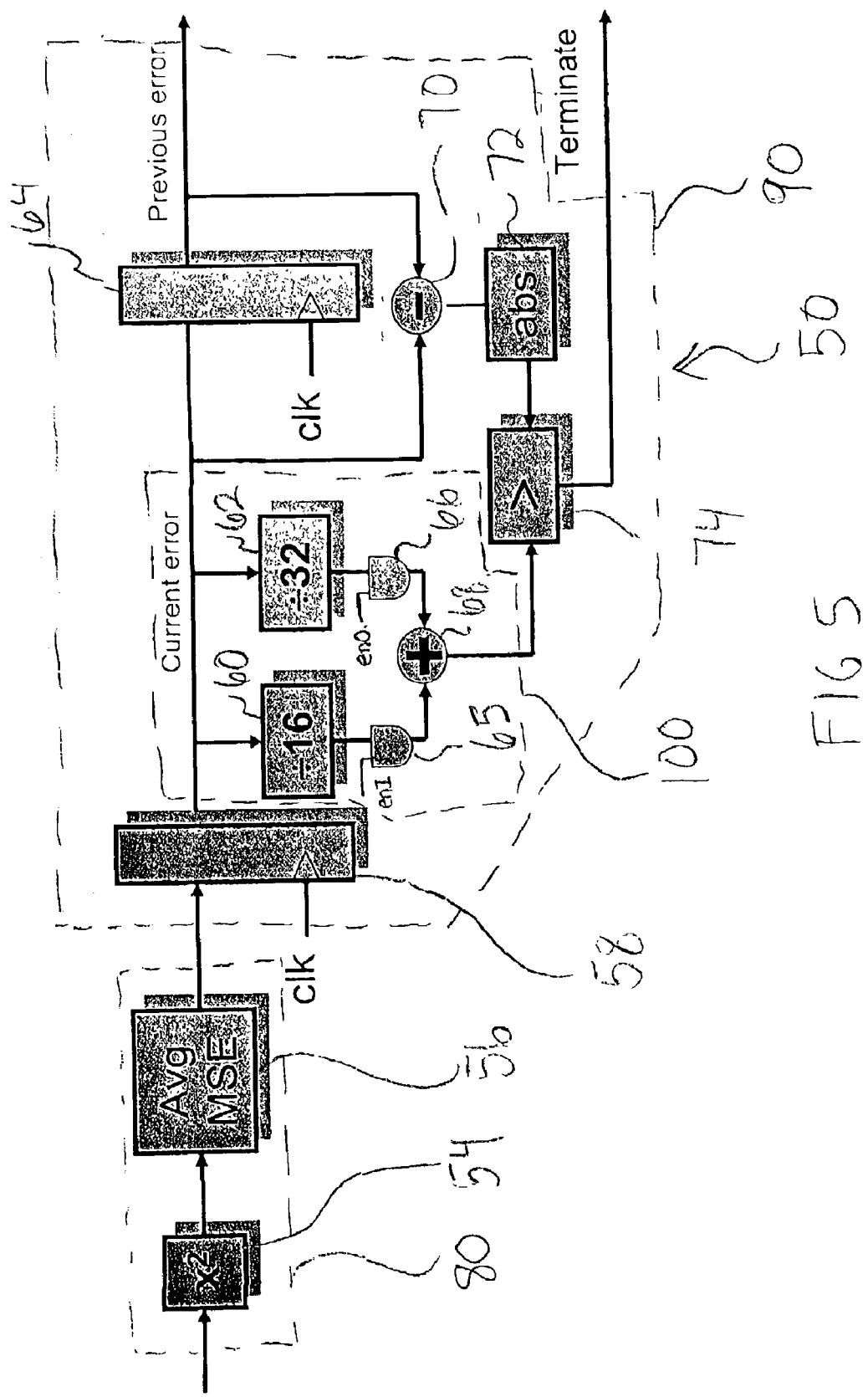
FIG. 5 is a schematic logic diagram of an error convergence measurement circuit constructed according to the principles of the present invention.

FIG. 5 illustrates in more detail the error convergence measurement circuit 50 that provides early termination of the training process by detecting the percentage change in the average of the signal error (i.e., predicting when the filter had converged to a good solution), thereby reducing, on average, the number of training iterations required for filter convergence. Generally, the error convergence measurement circuit 50 monitors the change in the error term (i.e., data signal error), determines when the MSE starts to reach its asymptotic value and outputs a terminate command if the average change in the MSE drops below a threshold. As should be appreciated by one skilled in the art, FIG. 5 is a logic diagram for implementing the error convergence measurement circuit 50 and the specific logic components shown therein represent specific component parts used to implement the termination algorithm for terminating the training process of the equalizer 20. The logic components may comprise one or more gates for implementing the specific component parts. The specific functions may be implemented using different logic components as desired or needed and are not limited to the specific ones illustrated. Further, some or all of the specific component parts may be constructed and implemented as an integrated circuit chip.

Specifically, the error convergence measurement circuit 50 includes an error detection circuit 80, which receives the error output from the slicer 34 shown in FIG. 4, and a convergence training terminating component 90. The error detection circuit 80 includes a squaring component 54 connected to an average mean square component 56. The squaring component 54 squares the input signal and the average mean square component 56 takes the average of the squared input signal, such that the average of the MSE is generated.

The output of the error detection circuit 80 is connected to a first shift register 58 (e.g., latch) in the convergence training terminating component 90. The first shift register 58 stores the average mean square error data (i.e., current error). The output of the first shift register 58 is connected to an accuracy selector 100 and the current error is output to the accuracy selector 100 when the first shift register 58 is clocked. A new current error is also stored by the first shift register 58 when clocked. Clocking may be provided in any known manner, including for example using a controller having a clock. The accuracy selector 100 includes a first divider 60 and a second divider 62. The first divider 60 divides the average of the mean square error by 16, and the second divider divides the average of the mean square error by 32. As should be appreciated by one skilled in the art, other combinations of divide values may be implemented by the first and second dividers 60 and 62 as desired or needed. The first divider 60 and second divider 62 provide selectable accuracy as described in more detail below.

The output of the first divider 60 is connected to a first AND gate 65 and the output of the second divider 62 is connected to a second AND gate 66. The first and second AND gates 65 and 66 are selectably enabled using "en1" and "en0", respectively, to provide a predetermined threshold value for terminating the convergence training process. The output of the first and second AND gates 65 and 66 are connected to an adder 68 to provide an additional level of selectable accuracy for termination of the convergence training process.

The output of the second shift register 64 and the output of the first shift register 58 are also supplied to a subtracter 70. Again, the output of the second shift register 64, like the output of the first shift register 58, is supplied when the second shift register 64 is clocked; this clocking being synchronous with the clocking of the first shift register 58. An absolute value component 72 takes the absolute value of the difference between a current measured error and a previous measured error output by the subtracter 70. The output of the adder 68 and the output of the absolute value component 72 are connected to a comparator 74 that determines whether the output of the adder 68 is greater than the output of the absolute value component 72. The output of the comparator 74 provides the control signal (i.e., terminate signal) to the FF filter 32, shown in FIG. 4, to terminate the tap training process when the difference between the previous error and current error has reached the threshold value as defined by the accuracy selector 100.

Having described in detail the structure of the error convergence measurement circuit 50 and provided a general description of the operation of each of the components of the error convergence measurement circuit 50 (i.e., error detection circuit 80, convergence training terminating component 90 and accuracy selector 100), a description of the overall operation of the error convergence measurement circuit 50 will now be provided. Specifically, the error detection circuit 80 determines an average of the mean square error for the signal (i.e., current error value), which is stored in the first shift register 58 when clocked. A current error value previously stored by the first shift register 58 is also output to and stored within the second register 64 when clocked, which now becomes the previous error. The current error value is also output to the accuracy selector 100 and the subtracter 70 when the first shift register 58 is clocked. Further, the previous error value stored within the second register 64 is output to the subtractor 70 when clocked.

Referring again to the accuracy selector 100, depending upon whether the first divider 60, the second divider 62, or both are selected, which is accomplished by enabling either the AND gate 65, the AND gate 66, or both, a selectable convergence threshold (i.e., accuracy level) is provided. Generally, 3% (i.e., 1/32), 6% (i.e., 1/16) and 9% (i.e., 1/32+1/16) threshold levels (i.e., threshold for percentage change in average of mean square error) may be selected (i.e., enabled) based upon the following:

3%—{en1, en0}=01
6%—{en1, en0}=10
9%—{en1, en0}=11

The accuracy selector 100 provides selectable accuracy of the convergence of the filter before terminating the training process, which is a measure of how accurate the filtering process must be before termination (i.e., when the convergence training terminating component 90 outputs a terminate signal). With only two combinations of binary shifts on the current MSE, the convergence training terminating component 90 using the accuracy selector 100 can provide 3.125% (i.e., 1/32), 6.25% (i.e., 1/16) or 9.375% (i.e., 1/32+1/16) accuracy levels for the termination criteria based upon the percentage change in the MSE. Thus, the accuracy selector 100 implements the following algorithms that define the termination criteria:

$$|\text{current error value} - \text{previous error value}| < 0.03125 * (\text{current error value})$$

|current error value−previous error value|<0.0625*
(current error value)

|current error value−previous error value|<0.09375*
(current error value)

The output of the accuracy selector 100 is compared to the difference of the current error value and the previous error value to determine if the threshold value has been reached (i.e., percentage change less than threshold value). As can be appreciated from the detailed structural and operational description provided, the error convergence measurement circuit 50 enables a filter, such as an equalizer, to self-terminate filter convergence with selectable accuracy independent of the operating environment of the filter, and typically with less iterations. Power consumption is reduced by reducing the number of iterations in the equalizer training process needed to achieve acceptable convergence.

Figure 6:
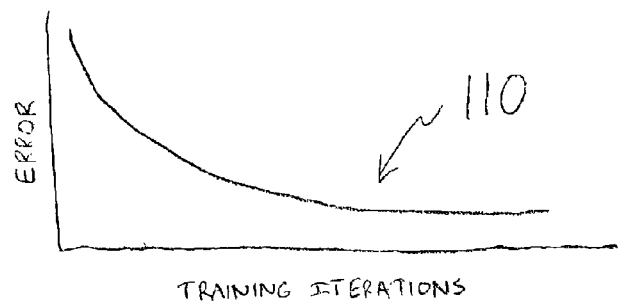
FIG. 6 is an graph of an exemplary convergence training curve.

Specifically, and as shown in FIG. 6, the data signal error is reduced after each iteration of the training process as a result of the application of a modified coefficient value to the equalizer taps using the FF filter 32 and FB filter 36. The error convergence measurement circuit 50 determines when the percentage change of the data signal error value (i.e., slope of the curve 110) reaches a predetermined threshold (i.e., point on the curve). Essentially, the error convergence measurement circuit 50 determines when the curve becomes asymptotic (i.e., generally flat) within a certain accuracy level and generates a control signal (i.e., terminate signal) for terminating convergence training.

Figure 7A:
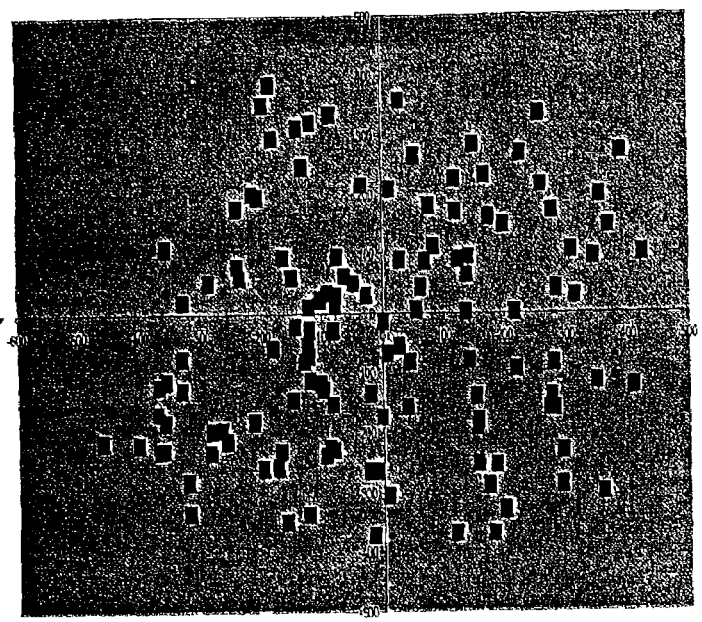
FIGS. 7(a) and 7(b) are constellation plots showing improved convergence of an equalizer using an error convergence measurement circuit of the present invention.
Figure 7B:
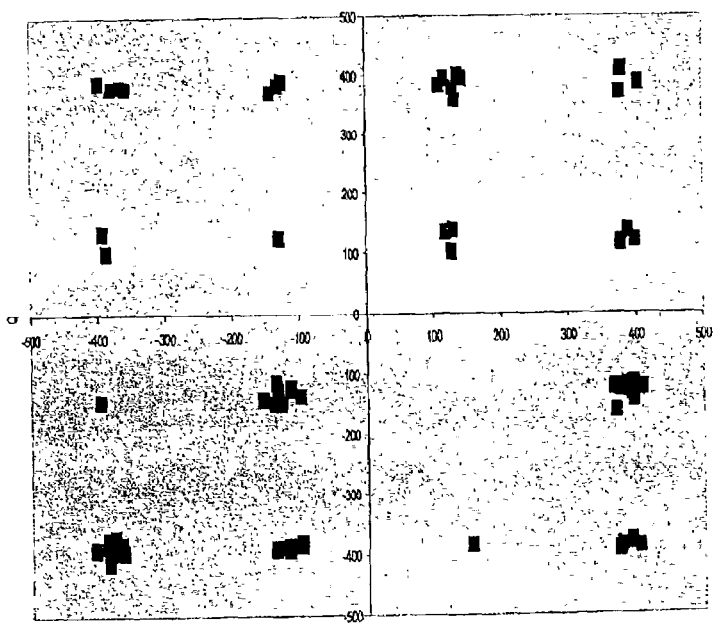

Thus, the error convergence measurement circuit 50 provides early termination of convergence training of a filter that does not require knowledge of the channel and operating SNR. As shown in FIGS. 7(*a*) and 7(*b*), data signal convergence for a particular constellation pattern is provided using less iterations of the convergence training process with selectable accuracy.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An error convergence measurement circuit for providing convergence of a filter comprising:
   a terminating component configured to terminate an iterative measurement process independent of an operating environment of the filter if a percentage difference in an error between a previous iteration and a present iteration is less than a threshold.

2. The error convergence measurement circuit according to claim 1, wherein the terminating component is configured to terminate said iterative measurement process independent of signal-to-noise ratio information.

3. The error convergence measurement circuit according to claim 1, wherein the terminating component is configured to terminate said iterative measurement process independent of channel information.

4. The error convergence measurement circuit according to claim 1, wherein the terminating component is configured for selectable accuracy of filter convergence.

5. The error convergence measurement circuit according to claim 4, wherein the terminating component comprises an accuracy selector for providing the selectable accuracy.

6. The error convergence measurement circuit according to claim 4, wherein the terminating component selects the accuracy of filter convergence by selecting the threshold.

7. The error convergence measurement circuit according to claim 6, wherein the threshold is selectable from a plurality of values.

8. The error convergence measurement circuit according to claim 1 further comprising an error detection circuit for determining the error for each of the iterations of the iterative measurement process.

9. The error convergence measurement circuit according to claim 4 further comprising a comparator for comparing the error value between iterations.

10. An equalizer comprising:
    an error detection circuit for measuring the difference between an actual signal and an expected signal of the equalizer to determine a data signal error value;
    a terminating component configured to terminate an iterative measurement process independent of an operating environment of the equalizer if a percentage difference in an error between a previous iteration and a present iteration is less than a threshold and based upon the data signal error value;
    an error calculation component for generating correction values; and
    a filter circuit having a plurality of taps for applying the generated correction values to the equalizer to compensate for the data signal error value.

11. The equalizer according to claim 10, wherein the terminating component is configured for selectable accuracy of said iterative measurement process.

12. The equalizer according to claim 10, wherein the percentage difference in the error between a previous iteration and a present iteration is an average of a mean square error.

13. The equalizer according to claim 12, wherein the terminating component is configured to terminate upon measuring a percentage change less than the threshold.

14. The equalizer according to claim 13, wherein the terminating component is configured for selecting the threshold from a plurality of values.

15. A method of providing convergence for a filter, the method comprising:
    determining a percentage change in a data signal error value based upon the comparison of a present data signal error value to a previous data signal error value; and
    terminating filter convergence based on the percentage change in the data signal error value and a threshold value.

16. The method according to claim 15, wherein the threshold value is selectable from a plurality of values.

17. The method according to claim 15, wherein the terminating step comprises terminating filter convergence when the percentage change is less than the threshold value.

18. A method of providing convergence for a filter, the method comprising:
    conducting an iterative measurement process; and
    terminating the iterative measurement process independent of an operating environment of the filter if a percentage difference in an error between a previous iteration and a present iteration is less than a threshold.

19. The method according to claim 18, wherein the terminating step is configured for selectable accuracy of filter convergence.

* * * * *